United States Patent
Chang

(10) Patent No.: US 10,234,481 B2
(45) Date of Patent: Mar. 19, 2019

(54) DETECTION DATA STORAGE DEVICE FOR DETECTION PROBE

(71) Applicant: PRIMAX ELECTRONIC LTD., Taipei (TW)

(72) Inventor: Pei-Ming Chang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 195 days.

(21) Appl. No.: 15/494,049

(22) Filed: Apr. 21, 2017

(65) Prior Publication Data

US 2017/0343581 A1    Nov. 30, 2017

(30) Foreign Application Priority Data

May 27, 2016   (TW) ............................. 105116768 A

(51) Int. Cl.
```
G01R 1/067    (2006.01)
G01R 27/02    (2006.01)
G01R 23/16    (2006.01)
G01R 21/00    (2006.01)
```

(52) U.S. Cl.
CPC ..... *G01R 1/06766* (2013.01); *G01R 1/06788* (2013.01); *G01R 21/00* (2013.01); *G01R 23/16* (2013.01); *G01R 27/02* (2013.01)

(58) Field of Classification Search
None
See application file for complete search history.

(56) References Cited

U.S. PATENT DOCUMENTS

| | | | | |
|---|---|---|---|---|
| 3,826,981 | A | * | 7/1974 | Ross ................ G01R 1/06766 324/149 |
| 3,836,852 | A | * | 9/1974 | Ross ................ G01R 1/06766 324/105 |

* cited by examiner

*Primary Examiner* — Paresh H Patel
(74) *Attorney, Agent, or Firm* — Kirton McConkie; Evan R. Witt

(57) ABSTRACT

A detection data storage device includes a detection probe, an inspection instrument, a processor and a storage controller. The processor includes a software component. The storage controller includes a key and a prompt lamp. When a circuit is detected by the detection probe, a detection signal is generated. After the detection signal is received by the inspection instrument, a detection data is generated and transmitted to the software component of the processor. If the software component judges that the detection data matches a standard value, the software components issues a prompt signal to the prompt lamp of the storage controller. In response to the prompt signal, the prompt lamp emits a light beam. After the light beam from the prompt lamp is received by the user and the key is pressed, the detection data is stored in a storage unit.

10 Claims, 5 Drawing Sheets

DETECTION DATA STORAGE DEVICE FOR DETECTION PROBE

FIELD OF THE INVENTION

The present invention relates to a storage device, and more particularly to a detection data storage device for a detection probe.

BACKGROUND OF THE INVENTION

A detection probe is used to detect a circuit board or a circuit or directly measure the electric signal (e.g., a current, a resistance or an electric wave) of the circuit board or the circuit. In addition, the detection probe is usually connected with an inspection instrument and a computer. After the electric signal is detected by the detection probe, the electric signal is converted into an inspection data by the inspection instrument. Then, the inspection data is transmitted to the computer. Consequently, the inspection instrument can be analyzed and stored by the computer.

FIG. 1 schematically illustrates a scenario of using a detection probe according to the prior art. As shown in FIG. 1, a user A operates a detection probe 90 to contact the detection probe 90 with a circuit 94. Consequently, an electric signal from the circuit 94 is detected by the detection probe 90. The electric signal is transmitted to an inspection instrument 91. Then, the electric signal is converted into a detection data 95 by the inspection instrument 91, and the detection data 95 is transmitted to a computer 93. Then, the user A operates an input device (e.g., a mouse 92) to analyze or store the detection data 95. While the user A carefully operates the detection probe 90 to contact the detection probe 90 with the circuit 94, the detection data 95 is also transmitted from the inspection instrument 91 to the computer 93. That is, if the user A wants to save the detection data 95, the user A has to distract to operate the detection probe 90 to obtain the detection data 95 and operate the mouse 92 to immediately save the detection data 95. Under this circumstance, the detecting result of the detection probe 90 readily results in an error, and thus the inconvenience of saving and analyzing the detection data increases. In other words, the conventional technologies need to be further improved.

SUMMARY OF THE INVENTION

For solving the drawbacks of the conventional technologies, the present invention provides a detection data storage device for a detection probe. A storage controller is installed on the detection probe. While the detection probe is used and a key of the storage controller is pressed, the detection data obtained by the detection probe can be directly stored. Moreover, a prompt lamp can provide a light beam to prompt the user whether the detection data complies with the standard criterion. In other words, the detection data storage device of the present invention is capable of precisely and conveniently storing the detection data.

In accordance with an aspect of the present invention, there is provided a detection data storage device. The detection data storage device includes a detection probe, an inspection instrument, a processor and a storage controller. The detection probe generates a detection signal. The inspection instrument is electrically connected with the detection probe. After the detection signal from the detection probe is received by the inspection instrument, a detection data is generated. The processor is electrically connected with the inspection instrument, and includes a software component. The software component receives the detection data from the inspection instrument. The software component includes a comparing unit and a storage unit. The comparing unit contains a standard value. The comparing unit generates a prompt signal when the detection data from the inspection instrument matches the standard value. The detection data from the inspection instrument is permitted to be stored in the storage unit. The storage controller is detachably installed on an outer shell of the detection probe and electrically connected with the processor. The storage controller includes a key and a prompt lamp. When the key is pressed by a user, a pressing signal is generated and transmitted to the software component of the processor, and the detection data from the inspection instrument is stored in the storage unit of the software component in response to the pressing signal. In response to the prompt signal from the comparing unit, the prompt lamp emits a light beam to prompt the user to press the key of the storage controller, so that the detection data is stored in the storage unit of the software component.

In an embodiment, the storage controller further includes a control unit. The control unit receives the prompt signal from the comparing unit. The pressing signal from the key is transmitted to the software component through control unit.

In an embodiment, after the prompt signal from the comparing unit is transmitted to the control unit of the storage controller, the control unit generates a control signal to the prompt lamp. In response to the control signal, the prompt lamp emits the light beam.

In an embodiment, after the pressing signal from the control unit is received by the software component, the software component generates a storing signal to the storage unit. In response to the storing signal, the detection data from the inspection instrument is stored in the storage unit.

In an embodiment, the storage controller further includes a sheath ring, and the sheath ring is detachably sheathed around the outer shell of the detection probe.

In an embodiment, the processor is included in a computer, and the standard value is inputted into the software component via the computer.

Preferably, the inspection instrument is an electricity meter, a spectrum analyzer or a resistance/current measuring device.

In an embodiment, after an electric signal of an object is detected by the detection probe, the detection signal is generated.

Preferably, the object is a circuit board or an electronic circuit.

Preferably, the electric signal is a resistance signal, a current signal or an electromagnetic signal.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments and accompanying drawings.

Figure 1:
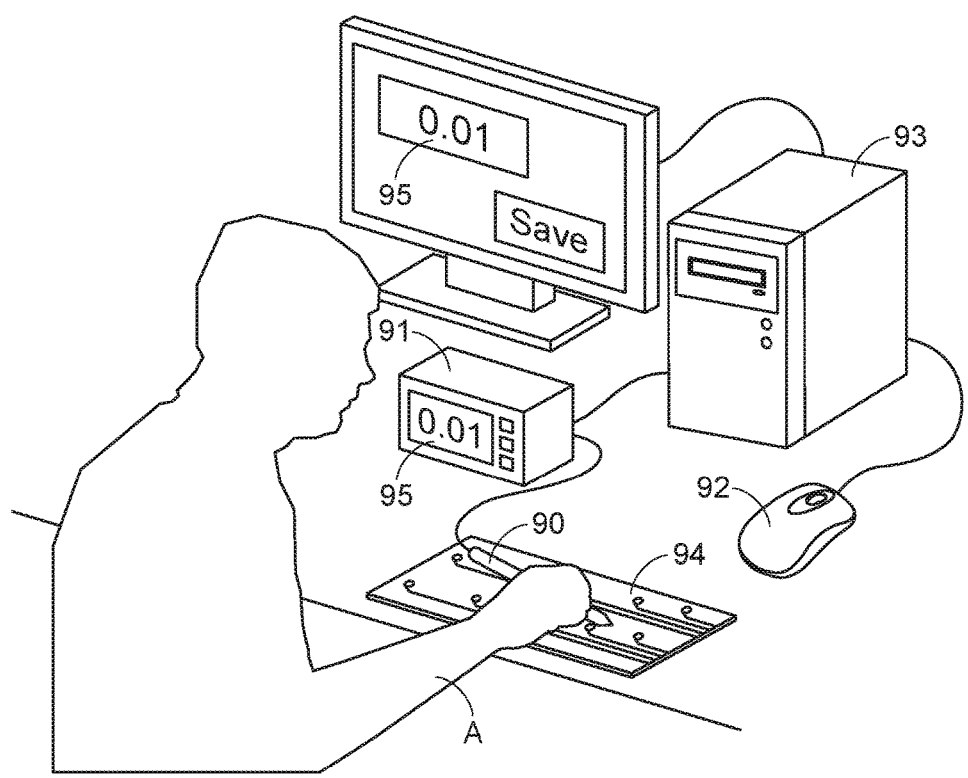
FIG. 1 schematically illustrates a scenario of using a detection probe according to the prior art.
Figure 2:
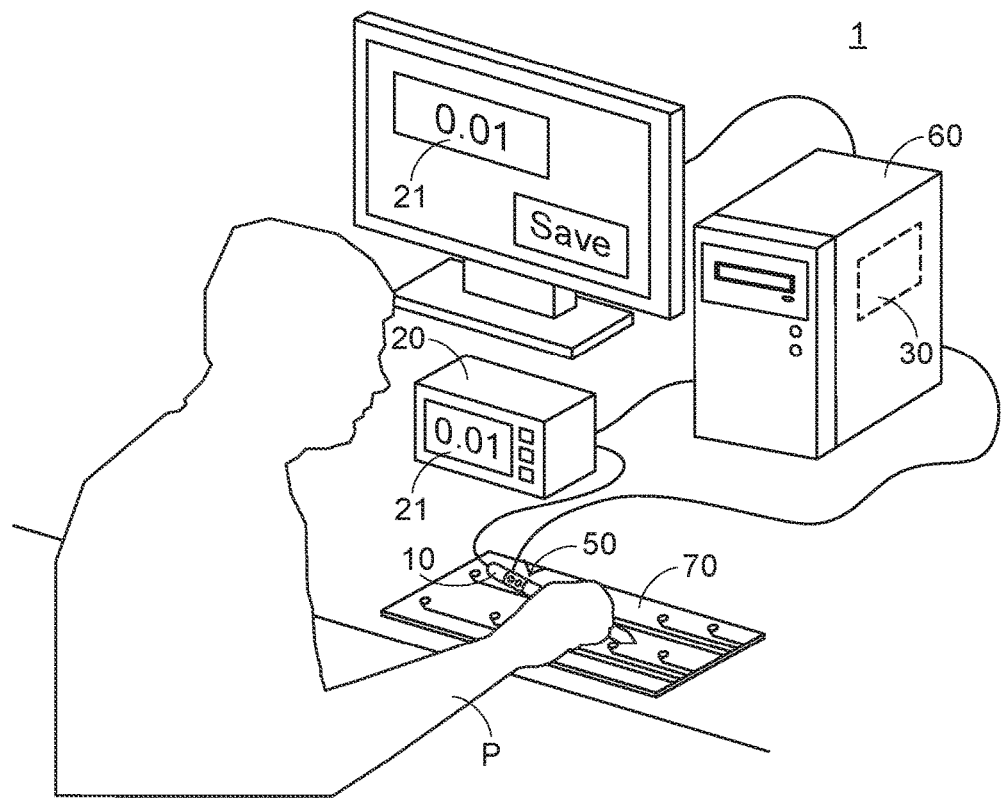
FIG. 2 schematically illustrates a detection data storage device for the detection probe according to an embodiment of the present invention.
Figure 3:
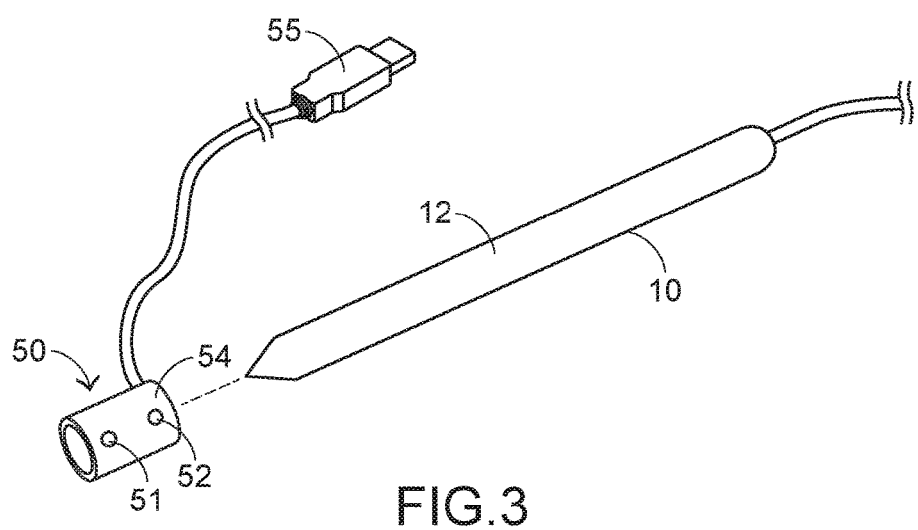
FIG. 3 is a schematic perspective view illustrating a detection probe and a storage controller of the detection data storage device according to the embodiment of the present invention.
Figure 4:
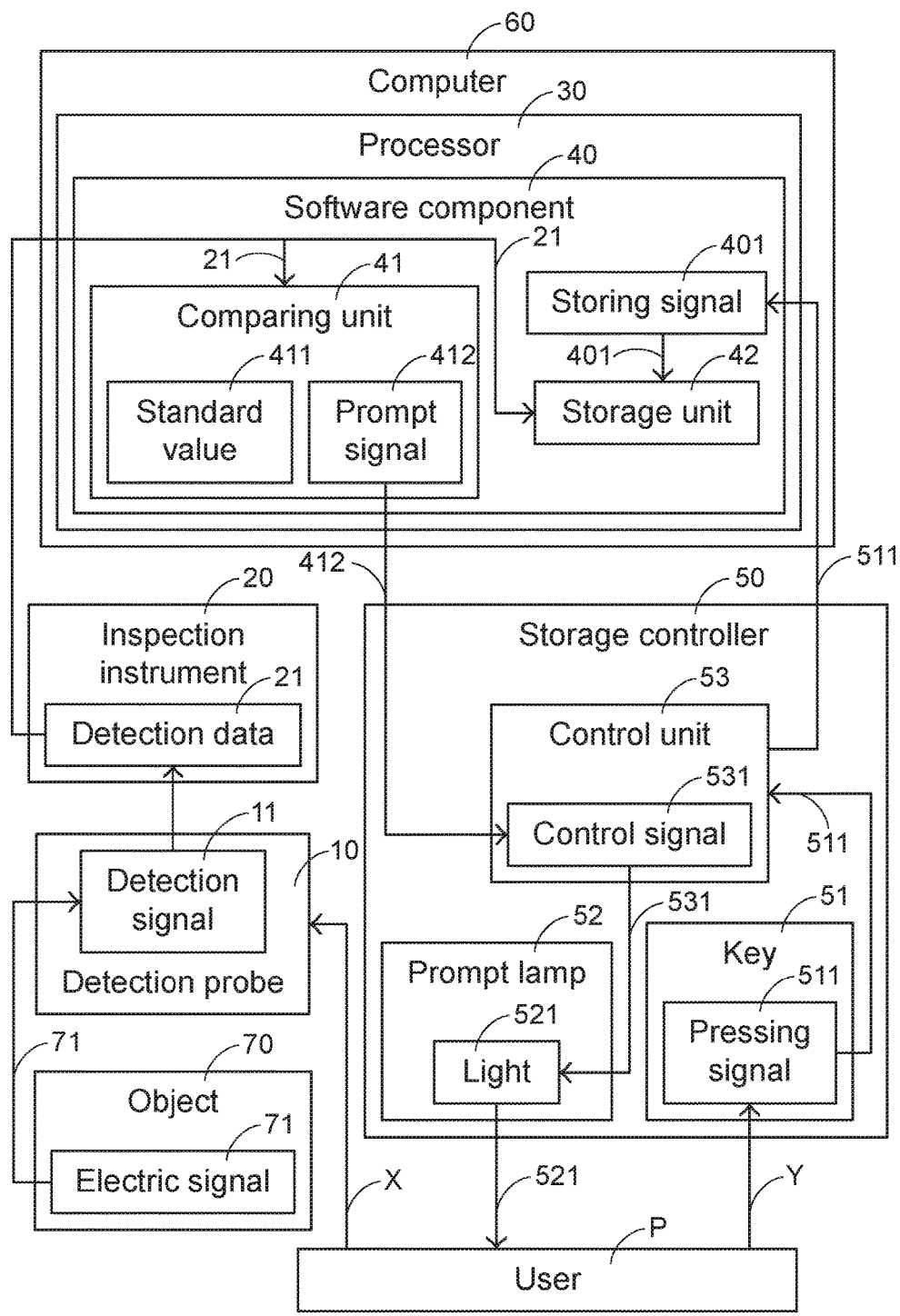
FIG. 4 is a schematic functional block diagram illustrating the detection data storage device according to the embodiment of the present invention.

FIG. 2 schematically illustrates a detection data storage device for the detection probe according to an embodiment of the present invention. FIG. 3 is a schematic perspective view illustrating a detection probe and a storage controller of the detection data storage device according to the embodiment of the present invention. FIG. 4 is a schematic functional block diagram illustrating the detection data storage device according to the embodiment of the present invention.

As shown in FIGS. 2, 3 and 4, the detection data storage device 1 comprises a detection probe 10, an inspection instrument 20, a processor 30 and a storage controller 50. The processor 30 comprises a software component 40. The software component 40 comprises a comparing unit 41 and a storage unit 42. The storage controller 50 comprises a key 51 and a prompt lamp 52. When a user P operates the detection probe 10 to detect an electric signal 71 of an object 70, the detection probe 10 generates a detection signal 11. The inspection instrument 20 is electrically connected with the detection probe 10. After the detection signal 11 is received by the inspection instrument 20, a detection data 21 is generated. The processor 30 is electrically connected with the inspection instrument 20. Moreover, the software component 40 of the processor 30 receives the detection data 21 from the inspection instrument 20. The comparing unit 41 of the software component 40 is used for judging whether the detection data 21 complies with a standard criterion. If the detection data 21 complies with the standard criterion, the comparing unit 41 generates a prompt signal 412. The storage unit 42 is used for storing the detection data 21. The storage controller 50 is detachably installed on an outer shell 12 of the detection probe 10. Moreover, the storage controller 50 is electrically connected with the processor 30. After the prompt signal 412 from the comparing unit 41 is received by the storage controller 50, the prompt lamp 52 of the storage controller 50 emits a light beam 521 to prompt the user P (see also FIG. 6). After the user P receives the prompt message of the light beam 521, the user P may press the key 51 of the storage controller 50. Consequently, the key 51 generates a pressing signal 511 to the storage unit 42 of the software component 40. In response to the pressing signal 511, the detection data 21 is stored in the storage unit 42.

The components of the detection data storage device 1 will be described in more details as follows. A standard value 411 is further stored in the comparing unit 41 of the software component 40 of the processor 30. According to the result of comparing the detection data 21 with the standard value 411, the comparing unit 41 judges whether the detection data 21 complies with the standard criterion. Preferably, the processor 30 is included in a computer 60. Via the computer 60, the user P may input the standard value 411 into the software component 40 according to the practical requirements. The storage controller 50 further comprises a control unit 53, a sheath ring 54 and a connector 55. The control unit 53 may receive the prompt signal 412 from the comparing unit 41 and transmit the pressing signal 511 to the storage unit 42 of the software component 40. The sheath ring 54 is detachably sheathed around the outer shell 12 of the detection probe 10. When the sheath ring 54 is sheathed around the outer shell 12 of the detection probe 10, the storage controller 50 is installed on the detection probe 10. Moreover, the connector 55 of the storage controller 50 is plugged into a connection port (e.g., a USB port) of the computer 60. Consequently, the storage controller 50 is electrically connected with the processor 30 of the computer 60 to transmit the prompt signal 412 and the pressing signal 511.

A process of transmitting associated signals will be described as follows. Please refer to FIG. 4 again. Firstly, the user P operates the detection probe 10 to perform a measuring operation X on the object 70. After the electric signal 71 from the object 70 is detected by the detection probe 10, the detection probe 10 generates a detection signal 11. After the inspection instrument 20 receives the detection signal 11, the inspection instrument 20 generates a detection data 21 and transmits the detection data 21 to the computer 60. After the software component 40 of the processor 30 of the computer 60 receives the detection data 21, the detection data 21 is transmitted to the comparing unit 41 and the storage unit 42. Then, the comparing unit 41 compares the received detection data 21 with the standard value 411. If the detection data 21 matches the standard value 411, the comparing unit 41 generates a prompt signal 412 and transmits the prompt signal 412 to the storage controller 50. After the prompt signal 412 is received by the storage controller 50, the control unit 53 generates a control signal 531 and transmits the control signal 531 to the prompt lamp 52. In response to the control signal 531, the prompt lamp 52 emits a light beam 521 to prompt the user P. After the user P receives the prompt message of the light beam 521, the user P may perform a pressing operation Y on the key 51 of the storage controller 50. Consequently, the key 51 generates a pressing signal 511. After the pressing signal 511 is received by the control unit 53 of the storage controller 50, the pressing signal 511 is transmitted from the control unit 53 to the processor 30 of the computer 60. After the pressing signal 511 is received by the software component 40 of the processor 30, the processor 30 generates a storing signal 401 and transmits the storing signal 401 to the storage unit 42. In response to the storing signal 401, the detection data 21 is stored in the storage unit 42.

Figure 5:
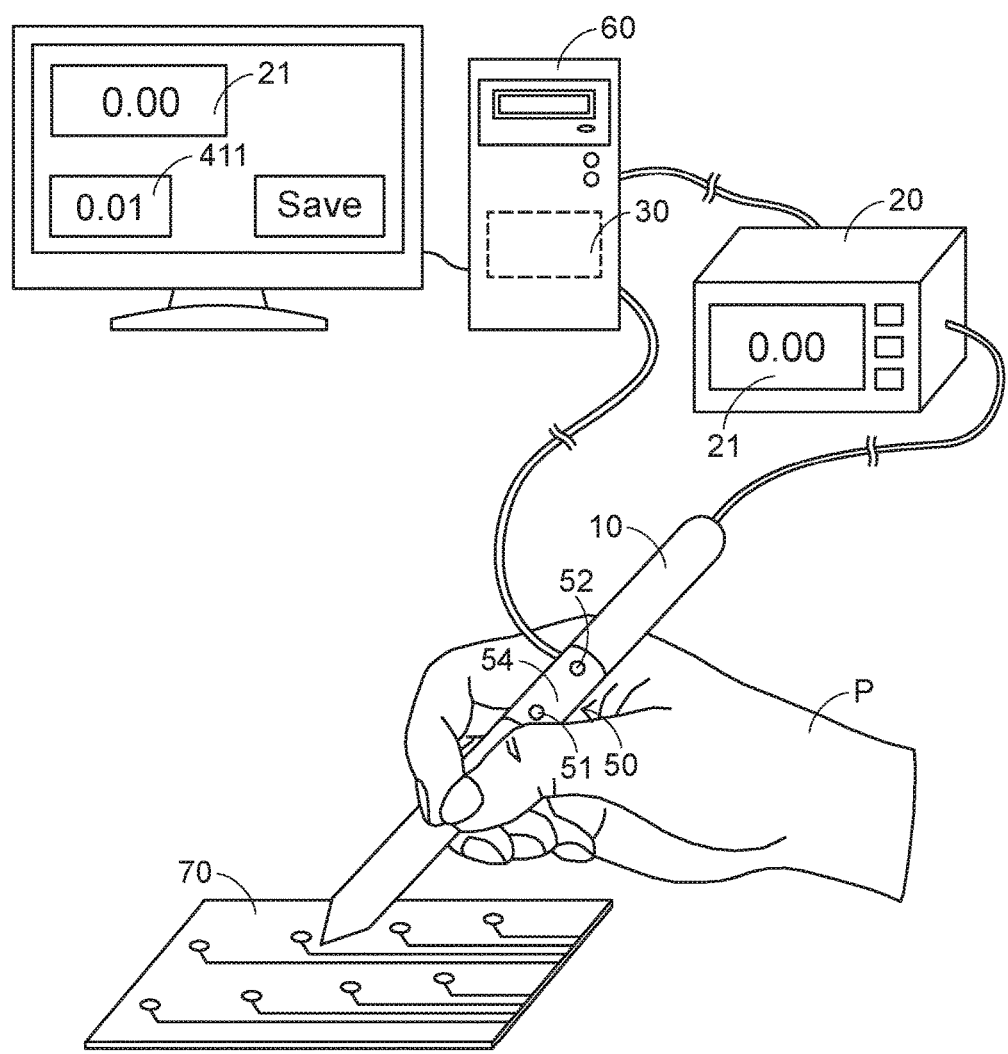
FIG. 5 schematically illustrates a step of using the detection data storage device to detect the circuit.
Figure 6:
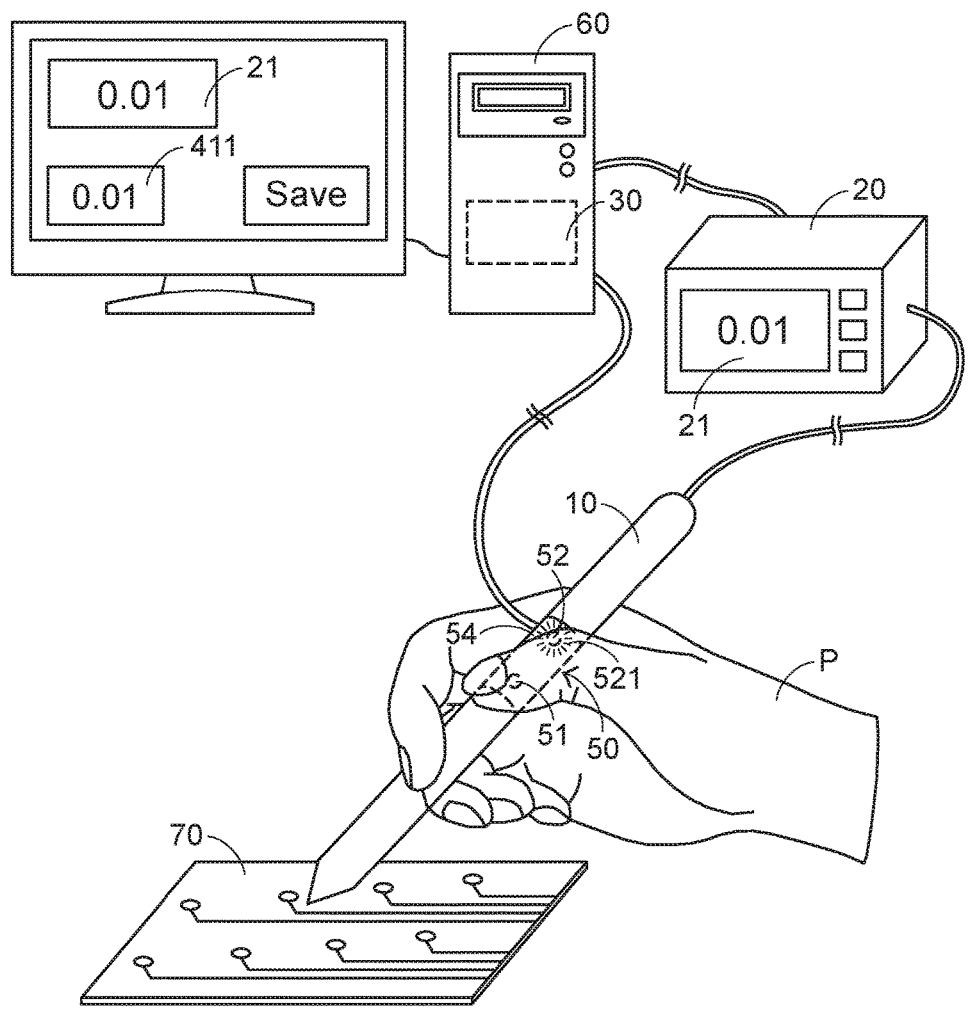
FIG. 6 schematically illustrates a step of using the detection data storage device to store the detection data.

A scenario of using the detection data storage device 1 will be described as follows. FIG. 5 schematically illustrates a step of using the detection data storage device to detect the circuit. FIG. 6 schematically illustrates a step of using the detection data storage device to store the detection data. Firstly, the user P holds the detection probe 10 with a single hand, and the user P contacts the detection probe 10 with the object 70. Consequently, the electric signal 71 from the object 70 is detected by the detection probe 10. If the object 70 is not accurately contacted with the detection probe 10, the electric signal 71 from the object 70 is weak or the electric signal cannot be transmitted because of defects, the electric signal 71 cannot be detected by the detection probe 10. Under this circumstance, the detection data 21 obtained by the inspection instrument 20 is zero. Since the detection data 21 received by the processor 30 of the computer 60 is zero, the comparing unit 41 of the software component 40 judges that the detection data 21 does not match the standard value 411. Meanwhile, the comparing unit 41 does not generate a prompt signal 412. Consequently, the prompt lamp 52 of the storage controller does not emit the light beam 521. Since the light beam 521 is not emitted, the user P does not need to press the key 51 to save the detection data 21.

If the electric signal 71 from the object 70 is accurately detected by the detection probe 10 when the detection probe 10 is held by the user, the detection signal 11 is transmitted from the detection probe 10 to the inspection instrument 20. Consequently, the inspection instrument 20 generates the detection data 21. Then, the detection data 21 is received by the processor 30 of the computer 60. If the software component 40 judges that the detection data 21 matches the standard value 411, the software component 40 generates the prompt signal 412. The prompt signal 412 is transmitted to the storage controller 50. In response to the prompt signal 412, the prompt lamp 52 of the storage controller 50 emits the light beam 521 to prompt the user P. After the user P presses the key 51 with the finger of the single hand, the key 51 generates the pressing signal 511 to the processor 30. In response to the pressing signal 511, the detection data 21 is stored in the storage unit 42 of the processor 30.

An example of the inspection instrument 20 includes but is not limited to an electricity meter, a resistance/current measuring device or a spectrum analyzer. An example of the object 70 includes but is not limited to a circuit board or an electronic circuit. An example of the electric signal includes but is not limited to a resistance signal, a current/voltage signal or an electromagnetic signal.

From the above descriptions, the storage controller 50 is installed on the detection probe 10. Moreover, the detection probe 10, the storage controller 50 and the processor 30 cooperate with each other to detect the electric signal. While the detection probe 10 is used, the detection probe 10 is held by the user with the single hand. By pressing the key 51 of the storage controller, the detection data 21 detected by the detection probe 10 can be directly stored. Moreover, the prompt lamp 52 can provide a light beam to prompt the user whether the detection data 21 complies with the standard criterion. In other words, the detection data storage device of the present invention is capable of precisely and conveniently storing the detection data 21.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A detection data storage device, comprising:
    a detection probe generating a detection signal;
    an inspection instrument electrically connected with the detection probe, wherein after the detection signal from the detection probe is received by the inspection instrument, a detection data is generated;
    a processor electrically connected with the inspection instrument, and comprising a software component, wherein the software component receives the detection data from the inspection instrument, and the software component comprises a comparing unit and a storage unit, wherein the comparing unit contains a standard value, and the comparing unit generates a prompt signal when the detection data from the inspection instrument matches the standard value, wherein the detection data from the inspection instrument is permitted to be stored in the storage unit; and
    a storage controller detachably installed on an outer shell of the detection probe and electrically connected with the processor, and comprising a key and a prompt lamp, wherein when the key is pressed by a user, a pressing signal is generated and transmitted to the software component of the processor, and the detection data from the inspection instrument is stored in the storage unit of the software component in response to the pressing signal, wherein in response to the prompt signal from the comparing unit, the prompt lamp emits a light beam to prompt the user to press the key of the storage controller, so that the detection data is stored in the storage unit of the software component.

2. The detection data storage device according to claim 1, wherein the storage controller further comprises a control unit, wherein the control unit receives the prompt signal from the comparing unit, and the pressing signal from the key is transmitted to the software component through control unit.

3. The detection data storage device according to claim 2, wherein after the prompt signal from the comparing unit is transmitted to the control unit of the storage controller, the control unit generates a control signal to the prompt lamp, wherein in response to the control signal, the prompt lamp emits the light beam.

4. The detection data storage device according to claim 2, wherein after the pressing signal from the control unit is received by the software component, the software component generates a storing signal to the storage unit, wherein in response to the storing signal, the detection data from the inspection instrument is stored in the storage unit.

5. The detection data storage device according to claim 1, wherein the storage controller further comprises a sheath ring, and the sheath ring is detachably sheathed around the outer shell of the detection probe.

6. The detection data storage device according to claim 1, wherein the processor is included in a computer, and the standard value is inputted into the software component via the computer.

7. The detection data storage device according to claim 1, wherein the inspection instrument is an electricity meter, a spectrum analyzer or a resistance/current measuring device.

8. The detection data storage device according to claim 1, wherein after an electric signal of an object is detected by the detection probe, the detection signal is generated.

9. The detection data storage device according to claim 8, wherein the object is a circuit board or an electronic circuit.

10. The detection data storage device according to claim 8, wherein the electric signal is a resistance signal, a current signal or an electromagnetic signal.

* * * * *